United States Patent
Lojek

(10) Patent No.: US 7,554,151 B2
(45) Date of Patent: Jun. 30, 2009

(54) LOW VOLTAGE NON-VOLATILE MEMORY CELL WITH ELECTRICALLY TRANSPARENT CONTROL GATE

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/265,854

(22) Filed: Nov. 3, 2005

(65) Prior Publication Data

US 2007/0096222 A1    May 3, 2007

(51) Int. Cl.
*H01L 29/788* (2006.01)
(52) U.S. Cl. ............... 257/316; 257/330; 257/390; 257/E27.103
(58) Field of Classification Search ........... 257/315, 257/316, 330, 390, 391, E27.103; 438/257
See application file for complete search history.

(56) References Cited

U.S. PATENT DOCUMENTS

| | | | | |
|---|---|---|---|---|
| 5,563,083 | A * | 10/1996 | Pein ................... | 438/259 |
| 5,714,781 | A * | 2/1998 | Yamamoto et al. ......... | 257/329 |
| 6,052,311 | A | 4/2000 | Fu ..................... | 365/185.33 |
| 6,060,739 | A * | 5/2000 | Saitoh .................. | 257/314 |
| 6,720,611 | B2 | 4/2004 | Jang ................... | 257/315 |
| 6,759,703 | B1 * | 7/2004 | Matsuhashi .............. | 257/306 |
| 6,906,379 | B2 | 6/2005 | Chen et al. .............. | 257/315 |
| 6,958,513 | B2 * | 10/2005 | Wang .................. | 257/330 |
| 2004/0004863 | A1 * | 1/2004 | Wang .................. | 365/199 |
| 2004/0065920 | A1 * | 4/2004 | Henson ................. | 257/330 |
| 2004/0248371 | A1 * | 12/2004 | Wang .................. | 438/330 |
| 2005/0169049 | A1 | 8/2005 | Lojek | |
| 2005/0194632 | A1 | 9/2005 | Lojek | |

FOREIGN PATENT DOCUMENTS

WO    WO-2007056682 A2    5/2007

OTHER PUBLICATIONS

"International Search Report and Written Opinion for Application No. PCT/US06/60510", 8 pages, Mar. 28, 2008.

* cited by examiner

*Primary Examiner*—Tuan N. Quach
(74) *Attorney, Agent, or Firm*—Schwegman, Lundberg & Woessner P.A.

(57) ABSTRACT

An EEPROM having a charge storage element, i.e., a floating gate, in the substrate adjacent to vertically separated source and drain electrodes. An electrically transparent poly control gate allows relatively low voltages to be used for program, erase, and read operations when a plurality of similar devices are arranged in a memory array. A second poly member, called a tunnel poly member, communicates with source and drain electrodes in synchronism with the poly control gate to provide charge carriers to the floating gate. Manufacturing involves a series of layers with minimal needs for photolithography.

22 Claims, 6 Drawing Sheets

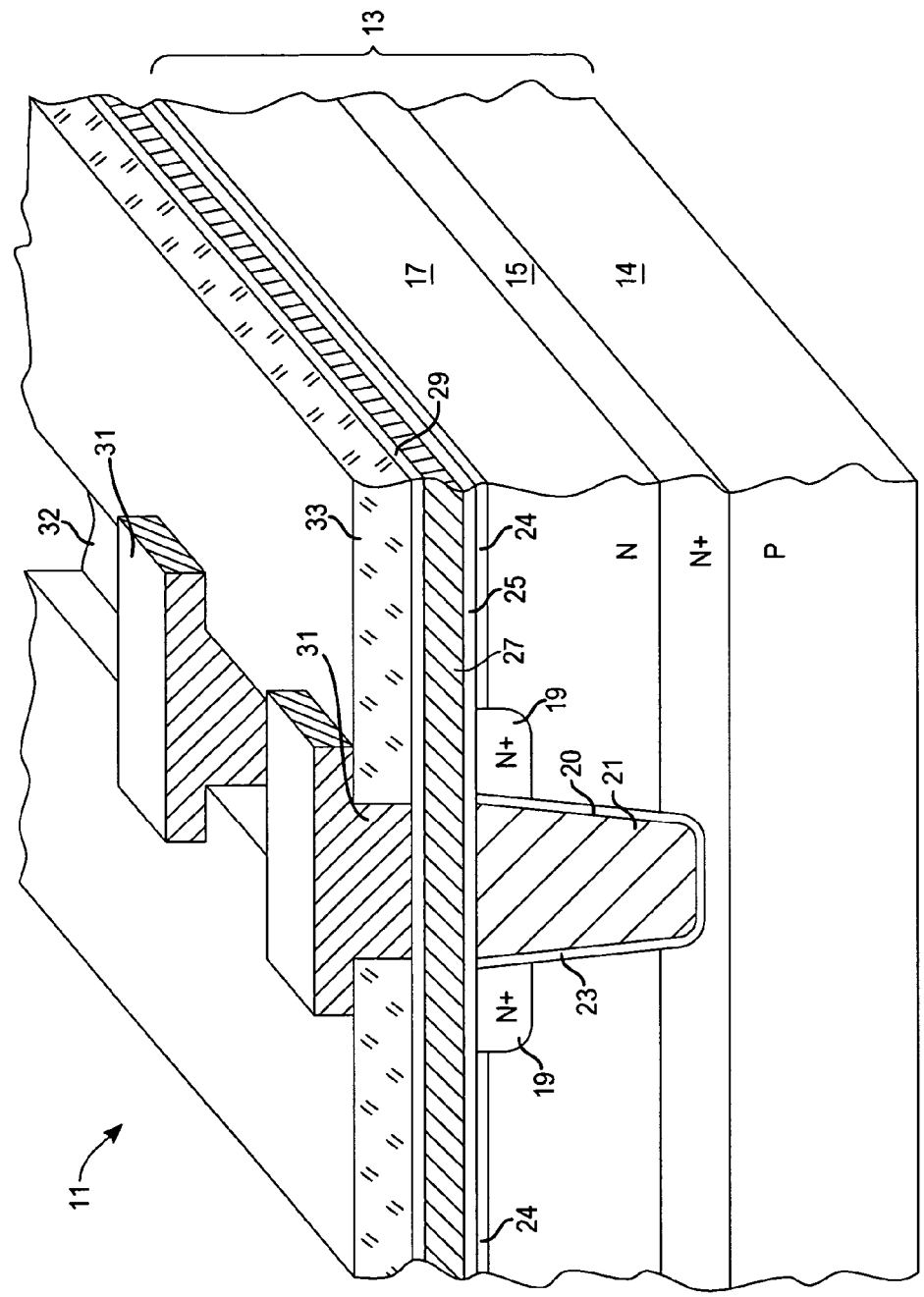
Fig._1

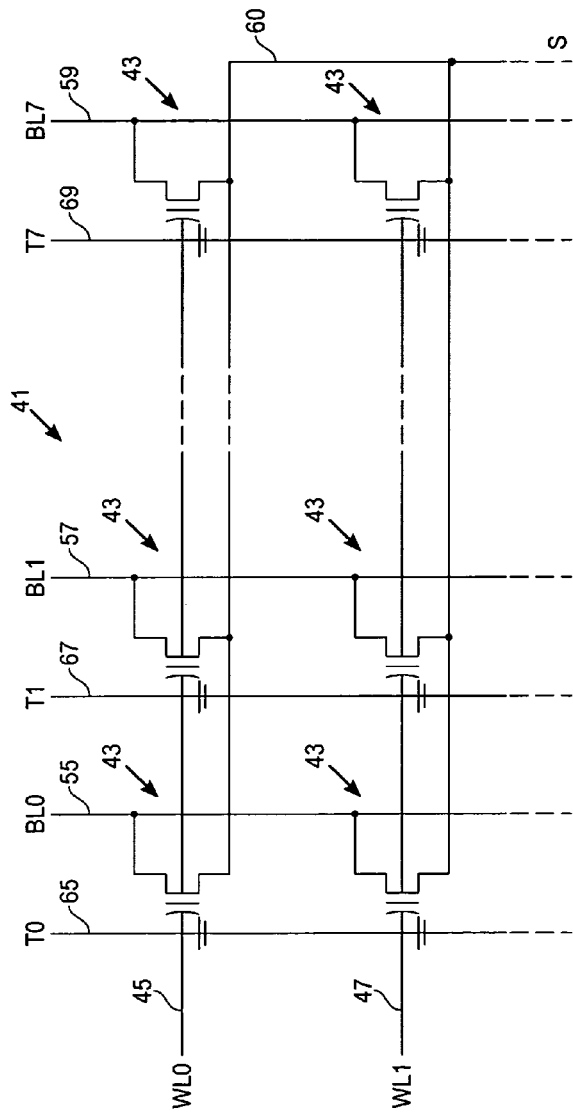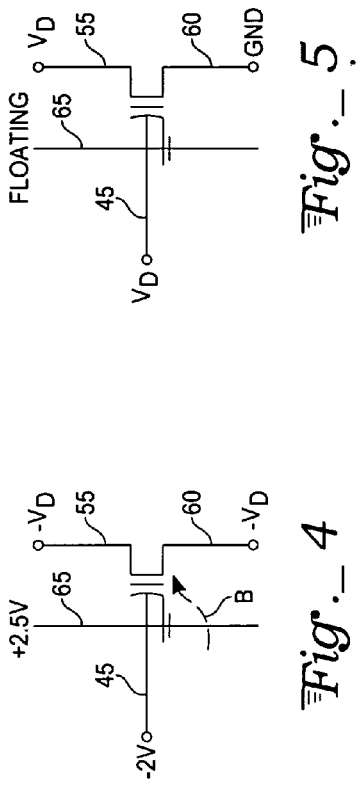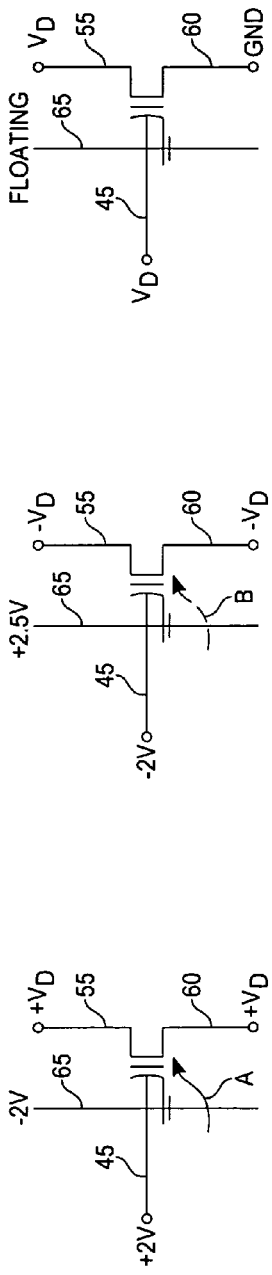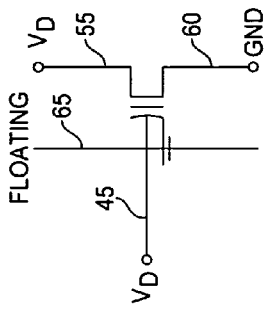

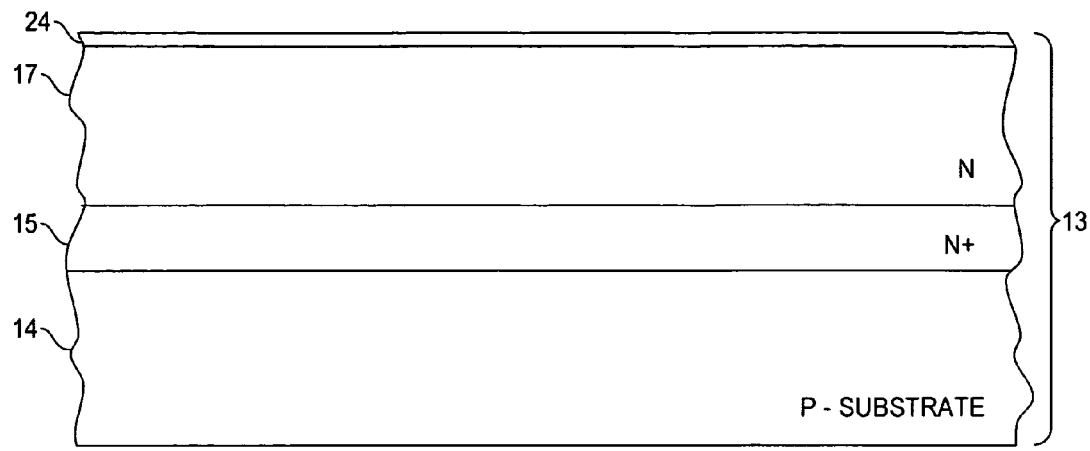
Fig._6
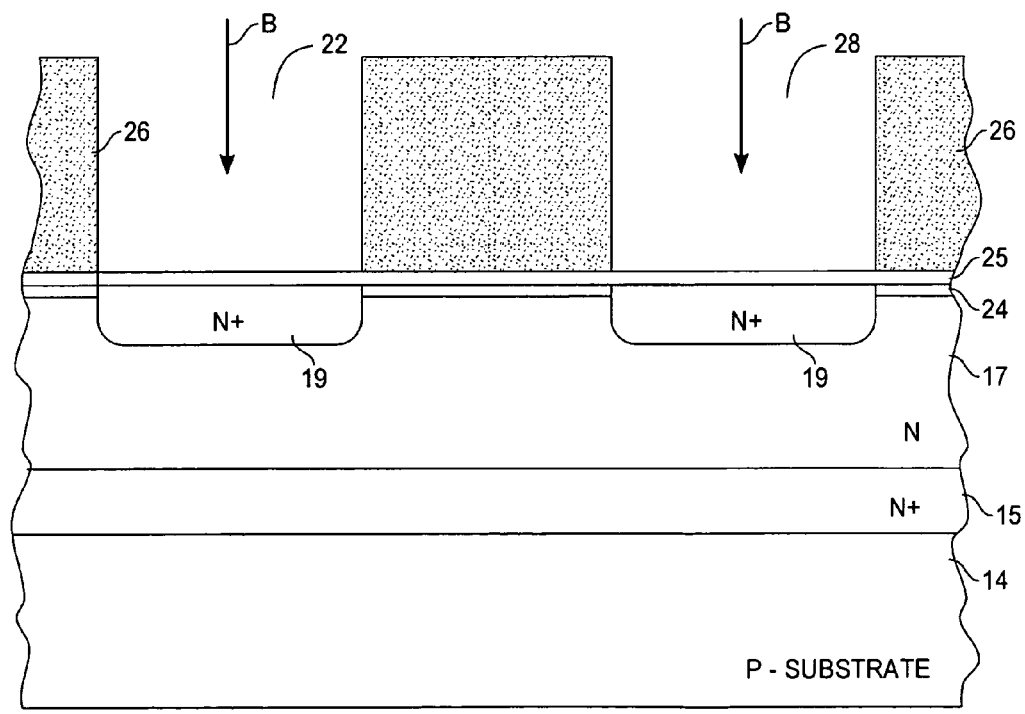
Fig._7

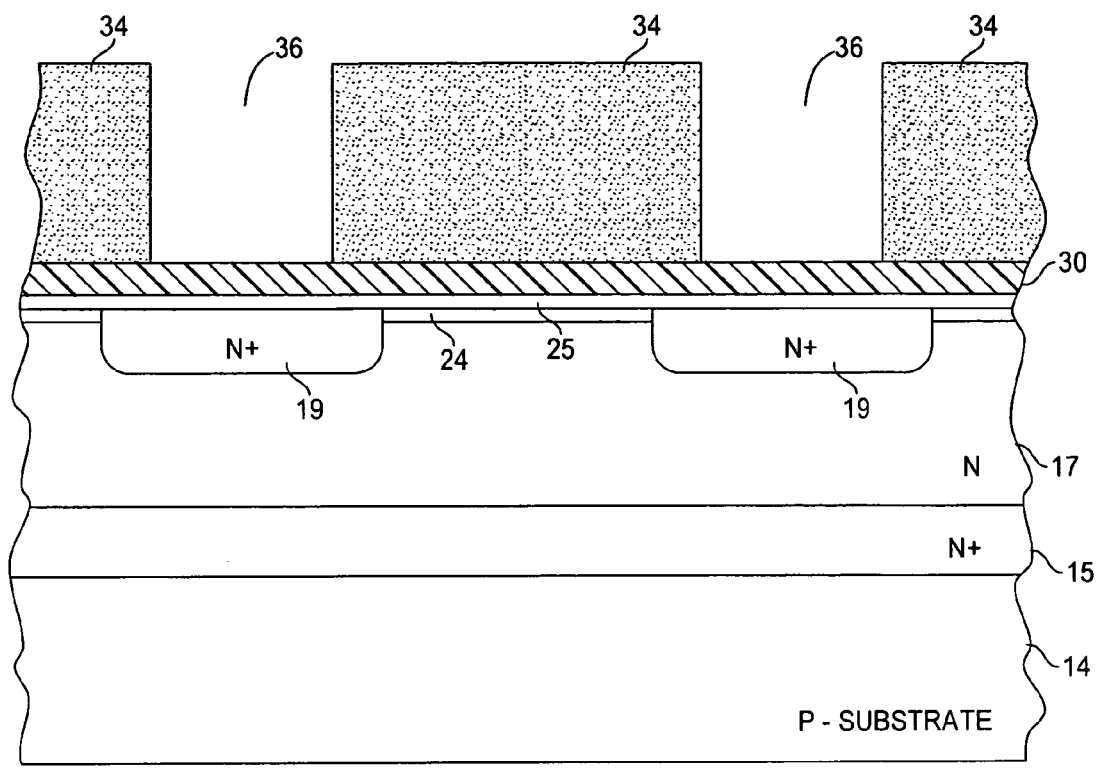
Fig._8
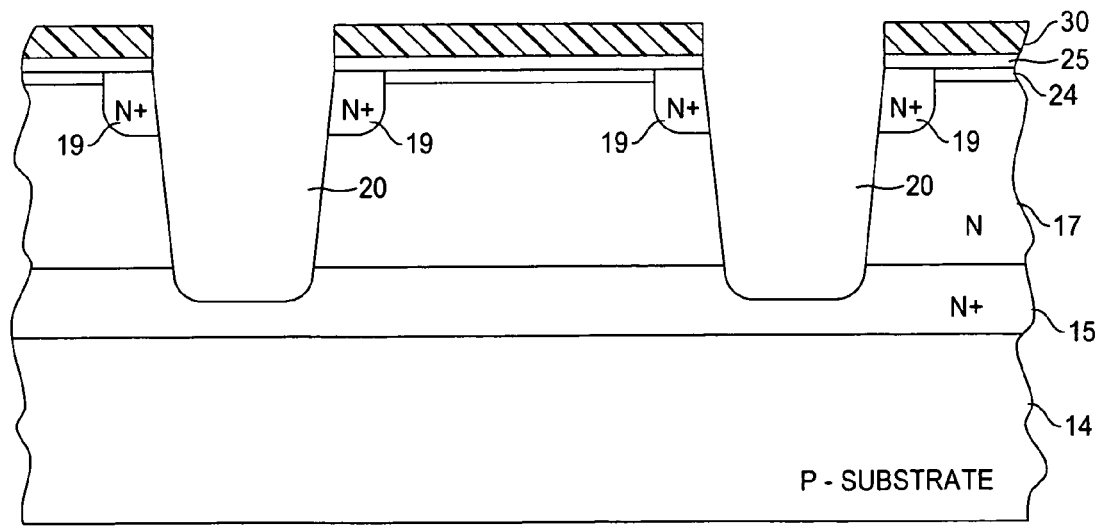
Fig._9

LOW VOLTAGE NON-VOLATILE MEMORY CELL WITH ELECTRICALLY TRANSPARENT CONTROL GATE

TECHNICAL FIELD

The invention relates to non-volatile semiconductor memory devices and, more particularly, to an EEPROM device of the type having a buried floating gate structure.

BACKGROUND ART

Buried floating gate structures in EEPROM devices are known as an alternative to customary floating gate devices where the floating gate is an isolated poly layer separated from the substrate by tunnel oxide. For example, U.S. Pat. No. 6,052,311 to Fu shows a floating gate within a substrate. Source and drain electrodes are located beside the floating gate and the control gate is located over the surface of the substrate above the floating gate and insulated from the floating gate. The patent teaches that a way to reduce the time for programming and the erasing the device is to enlarge the overlap between the floating gate and the control gate, that is, to raise the capacitive coupling ratio of the device. Another way to shorten programming and erase time is to increase voltage used for these operations. Because of shrinking device sizes, increasing voltage and concomitant power consumption is not a preferred alternative. Partially buried floating gate structures are shown in U.S. Pat. No. 6,720,611 to Jang and U.S. Pat. No. 6,906,379 to Chen et al.

One of the interesting aspects of the device of the '311 patent is that the channel region is shifted in a position to a location between the source and drain electrodes, but below the subsurface floating gate. In other words, the floating gate occupies the space normally occupied by the channel.

An object of the invention is an EEPROM device which is programmable with low voltages but that has fast programming and erase times.

SUMMARY OF INVENTION

A charge storage EEPROM transistor device is disclosed in which the charge storage element is disposed within a substrate with a very thin control gate layer directly above the charge storage element and the substrate, with a program layer electrode above the control gate layer electrode. The control gate layer electrode is electrically transparent to current between the charge storage element and the program layer electrode but finds use in reading charge in the charge storage element. The source and drain electrodes are also in the substrate with the charge storage element directly between these electrodes.

In the read mode, one of the source and drain electrodes is held at ground potential. With no charge on the charge storage element, the control gate electrode layer can be made to communicate with the source and drain electrodes creating measurable conduction to the source and drain. With charge on the charge storage element, a field associated with the charge storage element will block conduction between the control electrode and source and drain. For programming and the erase operations, voltage on the programming layer electrode causes charged particles to be kept off of the control layer electrode by an opposing voltage but the control layer electrode is so thin that charged particles tunnel through the control electrode toward the source and drain becoming trapped on the charge storage element with charge being attracted by the voltage on the source and drain electrodes. This is unusual because electrons usually only tunnel through thin oxide, called "tunnel oxide". Here, however, tunneling is through poly, as well as thin oxide on both planar sides of the poly layer. For erasing, a reverse procedure is used with voltage on the source and drain electrodes expelling charge from the charge storage element, which is drawn to the programming layer through the control gate layer. For both programming and the erase operations, the control gate layer draws little or no current.

BRIEF DESCRIPTION OF THE DRAWINGS

FIG. 1 is a perspective plan view of an EEPROM memory device in accord with the present invention.

FIG. 2 is an electrical plan of a memory array employing the memory devices of FIG. 1.

FIG. 3 is an electrical plan illustrating the programming mode of operation of the device of FIG. 1.

FIG. 4 is an electrical plan illustrating the erase mode of operation of the device of FIG. 1.

FIG. 5 is an electrical plan illustrating the read mode of operation of the device of FIG. 1.

FIGS. 6-12 are side sectional views illustrating principal manufacturing steps for the device of FIG. 1.

DESCRIPTION OF THE PREFERRED EMBODIMENT

Figure 10:
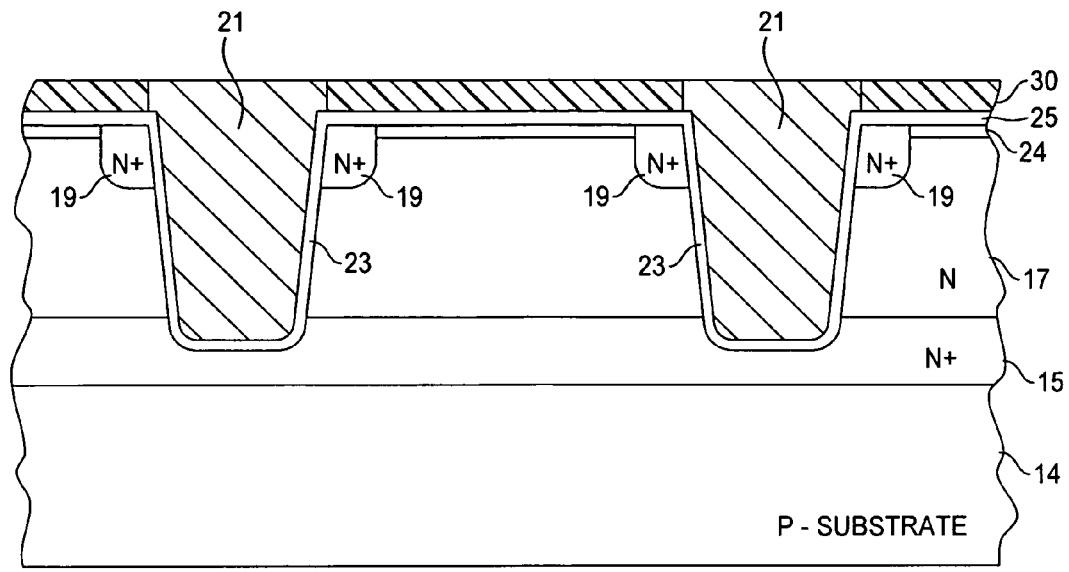

With reference to FIG. 1, a nonvolatile EEPROM memory device 11 has a substrate 13 with several constituent layers. Base layer 14 is typically of P-type semiconductor material, usually in a silicon wafer and has the thickness of the bulk material. An epitaxially grown N+ layer 15 over the base layer 14 forms a source layer. The conductivity of this layer is adequate for the layer to act as an electrode. Above the source layer 15 is an epitaxially grown well layer 17.

Within the well layer 17 and extending into source layer 15, a trench 20 is formed and filled with polysilicon, resembling a poly plug. The poly plug serves as a floating poly gate 21, bounded on all sides, except the top, by an oxide insulating layer 23. The floating poly gate 21 is surrounded at its top portion by drain regions 19, but is insulated from the drain regions by insulative oxide along the sides of the trench 20. The top of well layer 17 is covered by an implanted boron field layer 24, i.e., a field implant layer, which is about 1 k Angstroms thick and surrounds the drain regions 19, as well as the floating poly gate 21. Over the boron field implant layer 24 is a thin oxide layer 25 with a control poly layer 27 over the oxide layer 25 that is slightly thicker. Control poly layer 27 is planar and resides directly over oxide layer 25 but below a similar oxide layer 29, a tunnel oxide layer, in a sandwich configuration, with the opposed planar sides of the control poly layer 27 between the two oxide layers 25 and 29.

The thickness of control poly layer is about 50 Angstroms, preferably less rather than more, while each of the oxide layers 25 and 29 is about 40 Angstroms. The thickness of the poly layer must be of the order of the mean path of the carriers, i.e., electrons or holes. Because of the thickness of the poly layer, charge transport through the poly layer is electrically transparent, i.e., does not involve energy loss. In other words, since the poly has a thickness on the order of one mean free path of the charge carriers, there is no opportunity for scattering of the carriers leading to energy loss. This allows low voltages, i.e., about 2 volts more or less, to be used for program, erase and read operations. A tunnel poly region 31, a conductive plug fitting into a notch 32 that extends to tunnel oxide layer 29, resides over tunnel oxide layer 29, directly over floating poly gate 21. The tunnel poly region 31 is aligned with the floating poly gate 21 by the notch 32 in insulation layer 33 directly over tunnel oxide layer 29.

In operation, charge may be transferred onto the floating gate 21 by application of proper voltages of the control poly electrode and the drain electrode.

With reference to FIG. 2, memory array 41 has rows and columns that feature non-volatile memory transistors 43 that are the devices shown in FIG. 1. Each device defines a memory cell in the x-y memory array 41. The array includes word lines 45 and 47, bit lines 55, 57, and 59, as well as control poly lines 65, 67, and 69. The word lines 45 and 47 are associated with the control poly region 27 in FIG. 1. Each word line makes simultaneous electrical contact with a control poly layer that is common to all memory cells aligned with a notch 32. At the same time, the tunnel poly lines 65, 67, and 69 make contact with respective tunnel poly regions 31 in FIG. 1. Although the word lines 45 and 47 intersect the tunnel poly lines 65, 67, and 69 in FIG. 2 there is no electrical contact between these lines. Note that the bit lines 55, 57, and 59 connect to one electrode of the devices of a common column, say the source electrode, while the other subsurface electrode, the drain, is connected to a common array electrode on common line 60 that is held at a potential explained below in reference to FIGS. 3-5. By manipulating voltages on the word lines, bit lines, tunnel poly lines, and the common array electrode, appropriate voltages for writing, erasing and reading memory cells may be applied to the lines. Please note that select transistors and x-y address circuitry is not shown in order to simplify understanding of the invention, but such circuitry is well known to those skilled in the art.

In FIG. 3 voltages for writing are indicated on the various lines, with the arrow A designating a charge storage operation in which electrical charge is stored on the floating poly gate 21 in FIG. 1. A voltage of +2V is applied to word line 45 while a voltage of −2V is applied to tunnel poly line 65, a $+V_D$ voltage is applied to bit line 55 and a $+V_D$ voltage is applied to common source line 60. The value of the voltage $+V_D$ depends on the dimensions of source and drain electrodes, as well as other dimensions of the memory array. A typical range of voltage for $+V_D$ and $-V_D$ might be +3.0 V to −3.0 V.

In FIG. 4 voltages for erasing are indicated on the various lines, with the arrow B designating an erase operation in which electrical charge is cleared from the floating poly gate 21 in FIG. 1. A voltage of −2V is applied to word line 45 while a voltage of +2.5 V is applied to tunnel poly line 65, a $-V_D$ voltage is applied to bit line 55 and a $-V_D$ voltage is applied to common source line 60.

In FIG. 5 voltages for reading of stored charge or the absence of stored charge on the floating poly gate 21 in FIG. 1 are indicated on the various lines. A voltage of $V_D$ is applied to word line 45 while the tunnel poly line 65 is held floating, a $+V_D$ voltage is applied to bit line 55 while common source line 60 is held at ground potential. A sense transistor, not shown, is used to measure current from a memory cell relative to a threshold to determine the state of charge of the memory cell. Such sense transistors and associated circuitry are well known in the art.

In FIG. 6, the substrate 13 is seen to have a base layer 14 made of p-type material that is part of a doped semiconductor wafer. Over the base layer 14, a doped N+ epi layer 15 is formed. Electrical conductivity is sufficient that the layer forms a source electrode, i.e., the common line 60 in FIG. 2, termed source layer 15. Thickness of the source layer 15 is typically in the range of 500 Å-1500 Å but the thickness is not critical. Above source layer 15, an N epi well layer 17 that is considerably thicker than the epi layer 15, say 2500 Å-5000 Å thick. Into this well layer 17 a blanket boron field N+ implant layer 24 is formed. Boron field implant layer 24 is about 1 k Å thick.

In FIG. 7, field implant layer 24 is seen to have been covered by a pad oxide layer 25. Over this layer, a resist layer 26 is uniformly deposited across the wafer or wafer portion where devices are being fabricated. The resist layer 26 is patterned to create openings 22, 28 for an ion beam, indicated by arrows B, to created doped N+ drain regions 19 extending into the upper portion of well layer 17. The resist layer 26 is stripped away by conventional methods and the oxide surface is cleaned before deposition of a nitride layer 30 across the wafer portion where devices are being fabricated, as seen in FIG. 8. Nitride layer 30 is insulative and has a thickness sufficient to support a new photoresist mask 34 with openings 36 centered on drain regions 19 but not as wide as the drain regions. The openings 36 are used to pattern a deep etch through all layers 30, 25, 24, implant regions 19, and well layer 17 and extending partly into N+ source layer 15. The photoresist mask 34 is then removed, leaving nitride layer 30 as the top layer, as seen in FIG. 9.

Figure 11:
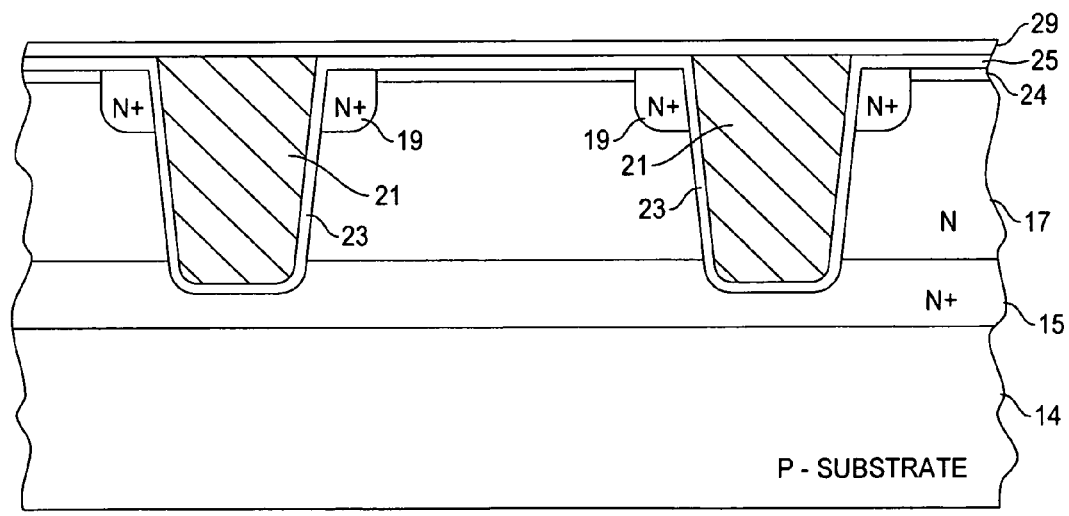

In FIG. 9, the deep etch trenches 20 are seen to split drain regions 19 so that the drain regions surround the uppermost region of trenches 20. In FIG. 10 the trenches 20 are lined with a thermal oxide lining 23, i.e., a gate oxide, then filled with polysilicon plugs that become floating polysilicon gates 21. Conductivity of the polysilicon plugs is adjusted by ion implantation into the plugs. The nitride layer 30 is then removed using a wet etch and the poly floating gates 21 are planarized with a dry etch. A top oxide sealant layer 29 is applied across the top of the device region as seen in FIG. 11. The thickness of this layer is approximately 40 Angstroms but his is not critical.

Figure 12:
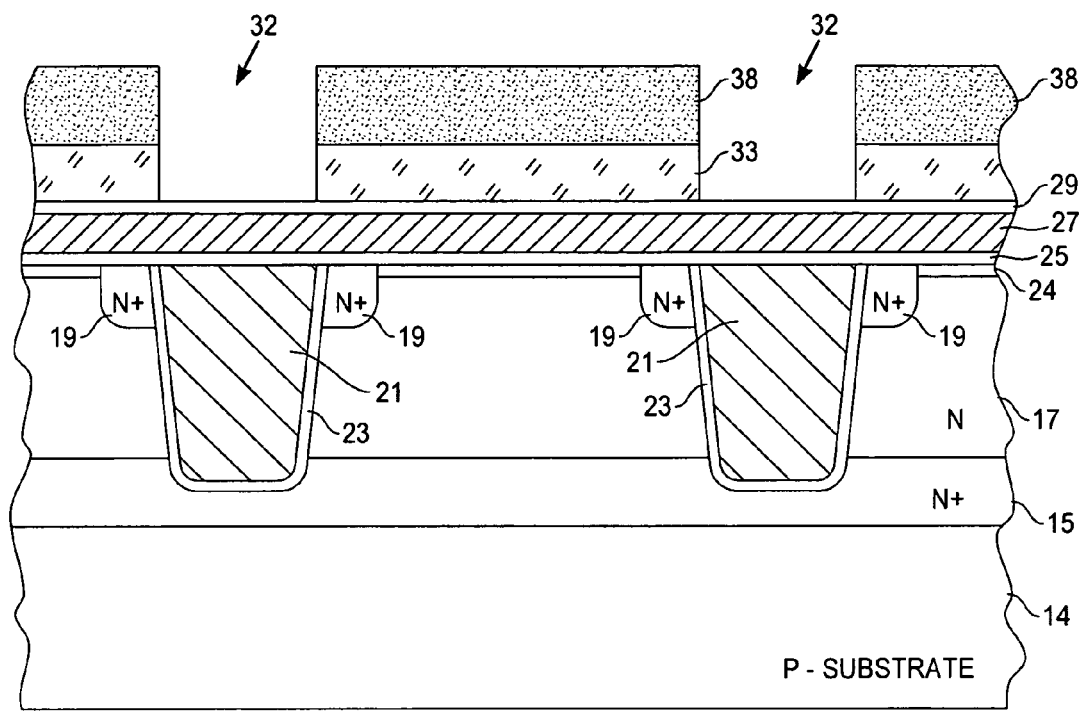

In FIG. 12, a thin P+ control poly layer 27, approximately 50 Angstroms thick extends over the pad oxide layer 25. The control poly layer 27 will function as a control gate as explained with reference to FIG. 2. Above the control poly layer 27 is tunnel oxide layer 29 which is also thin, say between 20 and 40 Angstroms thick. Above the tunnel oxide layer 29, a chemical vapor deposition oxide layer 33, sometimes known as TEOS, is deposited with a thickness in the range of 500-1000 Angstroms. A nitride layer, not shown, may optionally be deposited over oxide layer 33. Next, a photoresist layer 38 is deposited over oxide layer 33 and then patterned to create openings that form notch 32. The oxide in notch 32 is removed with an etch before the photoresist is removed. The wafer is cleaned and tunnel oxide is applied in the notch 32. Tunnel poly plugs 31 are applied over individual floating gates to drive electrical charge to and from the poly floating gates 21, as seen in FIG. 1.

What is claimed is:

1. A non-volatile memory device comprising:
   a substrate having a base layer of a first conductivity type;
   a source layer of a second conductivity type different from the first conductivity type and suitable for electrode use covering the base layer;
   a well layer of a conductivity type less conductive than the source layer disposed over the source layer, with spaced apart drain regions of the second conductivity type suitable for electrode use, and a trench between the drain regions;
   a conductive charge storage element in electrically floating relation seated in the trench;
   a first oxide layer over the well;
   a control poly layer over the first oxide layer having a thickness of 50 Å or less;
   a second oxide layer over the control poly layer;

an additional layer of the second conductivity type disposed between the well layer and the first oxide layer and disposed outside a region between the drain regions;

an insulative layer over the second oxide layer;

poly contacts disposed over the second oxide layer and over the charge storage element, at least a portion of the poly contacts disposed in a notch of the insulative layer in which the notch is positioned over the conductive charge storage element; and wherein the control poly layer is electrically transparent for charged particle tunneling through the poly.

2. The device of claim 1 wherein the base layer is P type.

3. The device of claim 1 wherein the source layer is N+ type.

4. The device of claim 1 wherein the well layer is N type.

5. The device of claim 1 wherein the drain regions are N+ type.

6. The device of claim 1 wherein the control poly layer has P type dopant.

7. The device of claim 1 wherein the conductive charge storage element has N type dopant.

8. The device of claim 1 wherein the poly contacts have an N type dopant.

9. The device of claim 1 wherein the additional layer is implanted with boron.

10. The device of claim 1 further comprising a nitride layer over the insulative layer.

11. A memory device comprising:
a substrate having a base layer of a first conductivity type, a source layer of a strongly doped second conductivity type over the base layer and a top layer of the second conductivity type over the source layer;
an insulated trench in the top layer filled with a first poly plug having an upward end;
a drain electrode of the strongly doped second conductivity type in proximity to the upward end of the poly plug within the top layer;
a conductive control layer over the poly plug having a thickness of 50Å or less in insulated relation to the poly plug by a first oxide layer;
an additional layer of the second conductivity type disposed between the top layer and the conductive control layer and disposed outside a region between the drain regions;
a second poly plug in insulated relation over the conductive control layer by a second oxide layer; and
wherein the control layer is electrically transparent for charged particle tunneling through the poly.

12. The device of claim 11 wherein word lines of a memory array are associated with the control poly layer.

13. The device of claim 11 wherein a bit line of a memory array is associated with one of the source and drain layers.

14. The device of claim 13 wherein a common line of a memory array is associated with the other of the source and drain layers.

15. The device of claim 13 wherein a tunnel poly line of a memory array is associated with a tunnel poly region.

16. In a memory cell device having a well over a source, a drain located at the well, an electrically floating conductive charge storage member in a trench of the well and a conductive electrode member in insulated relation to the source, drain, and charge storage member, but communicating charge carriers with the source and drain, the conductive electrode member in alignment with the charge storage member, an improvement for the device comprising:
a conductive layer interposed in insulated relation between the charge storage member and the conductive electrode member, the thickness of the conductive layer being 50 Å or less, whereby the conductive layer is electrically transparent to the charge carriers; and
a layer of a conductivity type different from a conductivity type of the well disposed between the well and the conductive layer and disposed outside a region between the drain regions.

17. The device of claim 16 wherein the memory cell device is arranged in rows and columns of a memory array.

18. The device of claim 17 wherein the memory array is controlled by four lines including for each device a word line, a bit line, a common line and a tunneling control line.

19. The device of claim 16 wherein the conductive electrode member is in vertical alignment with the charge storage member and spaced therefrom by the conductive layer.

20. A device comprising:
a base of a first conductivity type;
a source of a second conductivity type suitable for electrode use disposed over the base;
a well with spaced apart drain regions of the second conductivity type suitable for electrode use and a trench between the drain regions;
a conductive charge storage element in electrically floating relation seated in the trench;
a first oxide material over the well;
a control poly material over the first oxide material;
a second oxide material over the control poly material;
a material of the second conductivity type disposed between the well and the first oxide material and disposed outside a region between the drain regions;
an insulative material over the second oxide material; and
poly contacts disposed over the second oxide material and over the charge storage element, at least a portion of the poly contacts disposed in a notch of the insulative layer in which the notch is positioned over the conductive charge storage element.

21. The device of claim 20 wherein the material of the second conductivity type includes boron.

22. The device of claim 21 further comprising a nitride material over the insulative material.

* * * * *